(12) United States Patent
Deguchi et al.

(10) Patent No.: US 8,849,219 B2
(45) Date of Patent: Sep. 30, 2014

(54) DA CONVERTER AND WIRELESS COMMUNICATION APPARATUS

(75) Inventors: Jun Deguchi, Kawasaki (JP); Shouhei Kousai, Yokohama (JP); Yousuke Hagiwara, Kawasaki (JP); Masamichi Suzuki, Tokyo (JP); Atsuhiro Kinoshita, Kamakura (JP); Takao Marukame, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 219 days.

(21) Appl. No.: 13/599,413

(22) Filed: Aug. 30, 2012

(65) Prior Publication Data

US 2013/0252559 A1 Sep. 26, 2013

(30) Foreign Application Priority Data

Mar. 22, 2012 (JP) ................................. 2012-065167

(51) Int. Cl.
*H04B 1/38* (2006.01)
*H03M 1/66* (2006.01)
*H03M 1/10* (2006.01)
*H03M 1/74* (2006.01)

(52) U.S. Cl.
CPC ............... *H03M 1/66* (2013.01); *H03M 1/745* (2013.01); *H03M 1/1061* (2013.01)
USPC ........................................... 455/73; 341/144

(58) Field of Classification Search
USPC ........................ 455/73, 91; 341/136, 144, 150
See application file for complete search history.

(56) References Cited

U.S. PATENT DOCUMENTS

| 3,541,354 | A | * | 11/1970 | Basham ..................... 341/136 |
| 6,002,354 | A | | 12/1999 | Itoh et al. |
| 6,061,289 | A | | 5/2000 | Itoh et al. |
| 7,596,032 | B2 | | 9/2009 | Ogawa et al. |
| 7,729,165 | B2 | | 6/2010 | Wang |
| 7,800,951 | B2 | | 9/2010 | Saturdja |
| 7,969,787 | B2 | | 6/2011 | Ogawa et al. |
| 7,978,523 | B2 | | 7/2011 | Ogawa et al. |
| 8,014,206 | B2 | | 9/2011 | Saturdja |
| 8,045,388 | B2 | | 10/2011 | Ogawa et al. |

(Continued)

FOREIGN PATENT DOCUMENTS

JP 11-122109 A 4/1999
JP 2008-251149 A 10/2008

(Continued)

OTHER PUBLICATIONS

John Hyde, et al., "A 300-MS/s 14-bit Digital-to-Analog Converter in Logic CMOS", IEEE Journal of Solid-State Circuits, vol. 38, No. 5, May 2003, pp. 734-740.

*Primary Examiner* — Quochien B Vuong
(74) *Attorney, Agent, or Firm* — Oblon, Spivak, McClelland, Maier & Neustadt, L.L.P.

(57) ABSTRACT

In general, according to one embodiment, a DA converter configured to convert a digital signal comprising n (n>1) bits to an analog current to output the analog current from an output terminal, includes n voltage-current converters. Each of them corresponds to each bit of the digital signal and is configured to generate a current depending on the corresponding bit. A k-th (k is an integer of 0 to n−1) voltage-current converter includes a first transistor whose threshold voltage is adjustable. The first transistor includes a semiconductor substrate, a first diffusion region, a second diffusion region, an insulating film, a charge accumulating film, and a gate.

20 Claims, 8 Drawing Sheets

(56) References Cited

U.S. PATENT DOCUMENTS

| | | | |
|---|---|---|---|
| 8,130,584 B2 | 3/2012 | Ogawa et al. | |
| 8,149,626 B2 | 4/2012 | Saturdja | |
| 8,264,901 B2 | 9/2012 | Ogawa et al. | |
| 8,462,145 B2* | 6/2013 | Kim et al. | 345/208 |
| 8,581,824 B2* | 11/2013 | Baek et al. | 341/144 |
| 2004/0257251 A1* | 12/2004 | Hsueh | 341/136 |
| 2007/0002639 A1 | 1/2007 | Ogawa et al. | |
| 2008/0239820 A1 | 10/2008 | Wang | |
| 2009/0052256 A1 | 2/2009 | Saturdja | |
| 2009/0285019 A1 | 11/2009 | Ogawa et al. | |
| 2009/0290425 A1 | 11/2009 | Ogawa et al. | |
| 2010/0290291 A1 | 11/2010 | Ogawa et al. | |
| 2011/0001547 A1 | 1/2011 | Saturdja | |
| 2011/0032764 A1 | 2/2011 | Ogawa et al. | |
| 2011/0182116 A1 | 7/2011 | Ogawa et al. | |
| 2011/0310672 A1 | 12/2011 | Saturdja | |
| 2012/0069676 A1 | 3/2012 | Ogawa et al. | |
| 2012/0176846 A1 | 7/2012 | Saturdja | |

FOREIGN PATENT DOCUMENTS

| | | |
|---|---|---|
| JP | 2010-537360 A | 12/2010 |
| WO | WO 2007/000809 A1 | 1/2007 |
| WO | WO 2009/026364 A1 | 2/2009 |

\* cited by examiner 100 (THRESHOLD CONVERSION MODE)

US 8,849,219 B2

DA CONVERTER AND WIRELESS COMMUNICATION APPARATUS

CROSS REFERENCE TO RELATED APPLICATIONS

This application is based upon and claims the benefit of priority from the prior Japanese Patent Application No. 2012-65167, filed on Mar. 22, 2012, the entire contents of which are incorporated herein by reference.

FIELD

Embodiments described herein relate generally to a DA converter and a wireless communication apparatus.

BACKGROUND

In a wireless communication apparatus and the like, a DA (Digital to Analog) converter which converts a digital signal to an analog signal is used to transmit the signal to the outside. However, there is a problem that the accuracy of conversion degrades if threshold voltages of transistors in the DA converter vary due to a manufacturing process and so on.

DETAILED DESCRIPTION

In general, according to one embodiment, a DA converter configured to convert a digital signal comprising n (n>1) bits to an analog current to output the analog current from an output terminal, includes n voltage-current converters. Each of them corresponds to each bit of the digital signal and is configured to generate a current depending on the corresponding bit. A k-th (k is an integer of 0 to n−1) voltage-current converter includes a first switch, a first transistor whose threshold voltage is adjustable, and a second switch which are connected in series. The first switch is controlled by a value of the k-th bit of the digital signal or a first control signal. The first control signal is a signal for adjusting the threshold voltage of the first transistor. The second switch is controlled by a second control signal for adjusting the threshold voltage of the first transistor. The first transistor includes a semiconductor substrate, a first diffusion region, a second diffusion region, an insulating film, a charge accumulating film, and a gate. A reference voltage or a program voltage for adjusting the threshold voltage of the first transistor is applied to the semiconductor substrate. The first diffusion region and a second diffusion region are separated from each other in the semiconductor substrate. The first diffusion region is connected to the first switch, and the second diffusion region is connected to the second switch. The insulating film is on the semiconductor substrate between the first diffusion region and the second diffusion region. The charge accumulating film is on the insulating film. The charge accumulating film is capable of accumulate a charge. The gate is on the charge accumulating film. The program voltage or a predetermined bias voltage is applied to the gate.

Hereinafter, an embodiment will be specifically described with reference to the drawings.

Figure 1:
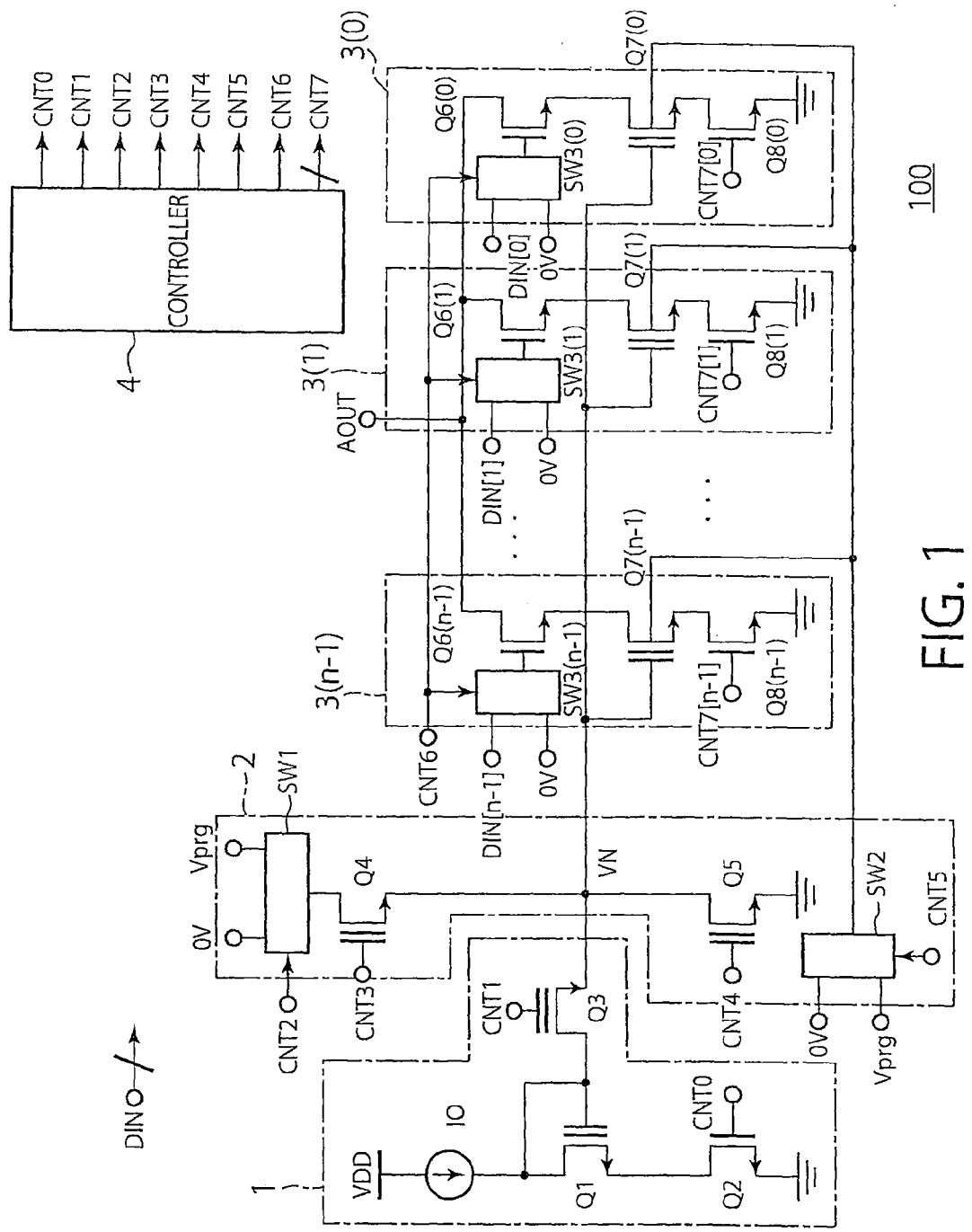
FIG. 1 is a circuit diagram of a DA converter 100.

FIG. 1 is a circuit diagram of a DA converter 100. The DA converter 100 is a current addition type DA converter which converts an input n-bit digital voltage signal DIN (n is an integer greater than or equal to 2) into an analog current signal AOUT.

The DA converter 100 includes a current mirror 1, a program module 2, n voltage-current converters 3($n$−1) to 3(0), and a controller 4.

The current mirror 1 supplies a predetermined bias voltage to the voltage-current converters 3($n$−1) to 3(0). The current mirror 1 includes a current source I0 and nMOS transistors Q1 and Q2 connected in series between a power terminal that supplies a power supply voltage VDD (for example, 3.3V) and a ground terminal that supplies a 0 V ground voltage, and further includes an nMOS transistor Q3 connected between the gate of the transistor Q1 and a node VN. The current source I0 is, for example, a pMOS transistor where a predetermined voltage is applied to the gate. The drain and the gate of the transistor Q1 is connected to each other. The transistor Q2 is a switch which is controlled to be on or off by a control signal CNT0 inputted into the gate. When the control signal CNT0 is high, the transistor Q2 is turned on and a current flows between the power terminal and the ground terminal. The transistor Q3 is a switch which is controlled to be on or off by a control signal CNT1 inputted into the gate. When the control signal CNT1 is high, the transistor Q3 is turned on and a gate voltage of the transistor Q1 is output to the node VN.

The program module 2 adjusts threshold voltages of transistors Q7($n$−1) to Q7(0) in the voltage-current converters 3($n$−1) to 3(0) described later. The program module 2 includes a switch SW1 and nMOS transistors Q4 and Q5 connected in series and a switch SW2. A voltage of 0 V and a program voltage Vprg of, for example, 10 V, which is higher than the power supply voltage VDD, are inputted into the switch SW1. One of these voltages is outputted according to a control signal CNT2. The transistor Q4 is a switch which is controlled to be on or off by a control signal CNT3 inputted into the gate. When the control signal CNT3 is high, the transistor Q4 is turned on and one of the voltages outputted from the switch SW1 is supplied to the node VN. The transistor Q5 is a switch which is controlled to be on or off by a control signal CNT4 inputted into the gate. When the control signal CNT4 is high, the transistor Q5 is turned on and the ground voltage is supplied to the node VN. A voltage of 0 V and the program voltage Vprg are inputted into the switch SW2 and one of these voltages is outputted to the voltage-current converters 3($n$−1) to 3(0) according to a control signal CNT5.

Each of the voltage-current converters 3($n$−1) to 3(0) has the same configuration, so that the voltage-current converters 3($n$−1) to 3(0) are described as a voltage-current converter 3($k$) (k is an integer from 0 to n−1) as a representative. The voltage-current converter 3($k$) generates a predetermined current when a value DIN[k] of k-th bit of the input digital signal DIN is high. The voltage-current converter 3($k$) includes nMOS transistors Q6($k$), Q7($k$), and Q8($k$) connected in series between an output terminal where an output current AOUT is generated and a ground terminal, and further includes a switch SW3(k). A value DIN[k] and 0 V are inputted into the switch SW3(k) and one of these is outputted to the gate of the transistor Q6(k) according to a control signal CNT6 (a first control signal). The transistor Q6(k) is a switch which is controlled to be on or off by a signal inputted into the gate.

The gate of the transistor Q7(k) is connected to the node VN and a voltage outputted from the switch SW2 is supplied to a substrate (body). As described later, one of the features of the present embodiment is that the transistor Q7(k) is a transistor whose threshold voltage can be adjusted, so that the threshold voltages of the transistors Q7(n−1) to Q7(0) in the voltage-current converters 3(n−1) to 3(0) can be adjusted to a certain value.

The transistor Q8(k) is a switch which is controlled by a control signal CNT7(k) (a second control signal) inputted into the gate.

The controller 4 generates the control signals CNT0 to CNT7 for controlling the switches (including transistors functioning as a switch). Although the control signals CNT0 to CNT6 are 1-bit digital signals, the control signal CNT7 is an n-bit digital signal as well as the input digital signal DIN.

Note that, although not shown in the circuit of FIG. 1, substrates of pMOS transistors are connected to the power terminal and substrates of nMOS transistors are connected to the ground terminal.

Next, the transistor Q7(k) whose threshold voltage can be adjusted will be described in detail.

Figure 2:
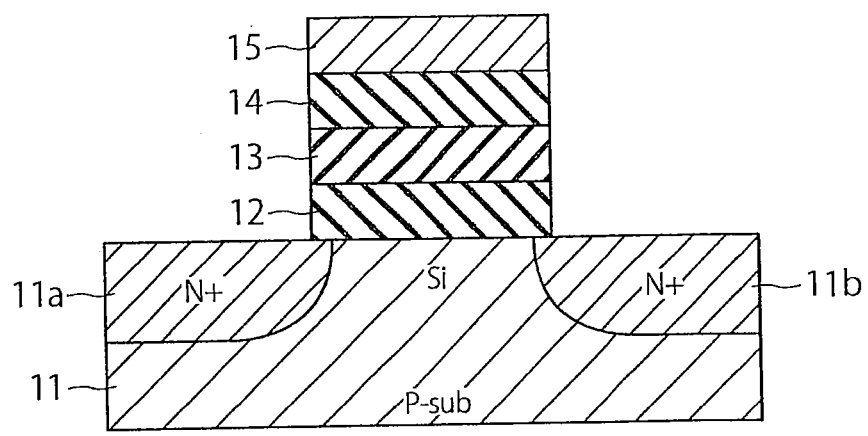
FIG. 2 is a schematic cross-sectional view of the transistor Q7($k$).

FIG. 2 is a schematic cross-sectional view of the transistor Q7(k). The transistor Q7(k) is a transistor having a so-called SONOS (Silicon/silicon Oxide/silicon Nitride/silicon Oxide/poly Silicon) structure, which includes a p-type silicon substrate 11, n-type diffusion regions 11a and 11b formed on the silicon substrate 11, and a tunnel oxide film 12, a silicon nitride film 13, a silicon oxide film 14, and a polysilicon layer 15 which are stacked on a channel region formed between the n-type diffusion regions 11a and 11b. One of the n-type diffusion regions 11a and 11b corresponds to the drain and the other corresponds to the source. The polysilicon layer 15 corresponds to the gate.

For example, the tunnel oxide film 12 has a structure in which a first silicon oxide film, a silicon layer formed by microcrystalline silicon grains that satisfy the Coulomb blockade condition, and a second silicon oxide film, are stacked. The thicknesses of the first silicon oxide film, the silicon layer, and the second silicon oxide film are about 1 nm, 2 nm, and 1 nm, respectively, for example.

The silicon nitride film 13 is a floating gate which can accumulate charge. The thickness thereof is, for example, about 20 nm. The composition ratio of silicon and nitrogen of the silicon nitride film 13 is set to 9:10 ($Si_9N_{10}$) where the ratio of silicon is larger than that in a composition ratio of 3:4 ($Si_3N_4$) which satisfies the stoichiometry, so that electron trap by silicon dangling bond increases in the silicon nitride film 13. Therefore, even when the length of the gate is short, electron trap density can be secured.

The thicknesses of the silicon nitride film 14 and the polysilicon layer 15 are about 8 nm and 200 nm, respectively, for example.

The transistor Q7(k) is manufactured as described below for example. First, the surface of the silicon substrate 11 is thermally oxidized to form a silicon oxide film, which will be the first silicon oxide film. On the silicon oxide film, an amorphous silicon film is deposited by a CVD (Chemical Vapor Deposition) manner. Further, the surface of the amorphous silicon film is thermally oxidized to form a silicon oxide film, which will be the second silicon oxide film. Thereafter, high temperature annealing at 900 degrees C. is performed in a nitrogen atmosphere, so that the amorphous silicon film is changed to a silicon layer. Thereby, a silicon oxide film, which will be the tunnel oxide film 12, is formed.

Subsequently, on the silicon oxide film which will be the tunnel oxide film 12, a silicon nitride film, which will be the silicon nitride film 13, is formed by an LPCVD (Low Pressure Chemical Vapor Deposition) manner. At this time, in order to increase the ratio of silicon, a ratio of silicon source gas to nitrogen source gas is set to higher than normal. Next, on the silicon nitride film 13, a silicon oxide film, which will be the silicon oxide film 14, is formed by the LVCVD manner. Further, on the silicon oxide film 14, an n-type polysilicon layer, which will be the polysilicon layer 15, is formed by the CVD manner.

Then, the formed layers (films) are patterned, so that the polysilicon layer 15, the silicon oxide film 14, the silicon nitride film 13, and the tunnel oxide film 12 are formed. Thereafter, phosphorus ion is implanted into the silicon substrate 11 and the substrate 11 is annealed, so that the n-type diffusion regions 11a and 11b are formed.

The threshold voltage of the transistor Q7(k) can be adjusted according to the amount of charge accumulated in the silicon nitride film 13. When the charge is accumulated in the silicon nitride film 13, even if a positive voltage is applied to the gate, that is, the polysilicon layer 15, the voltage is cancelled by the accumulated charge, so that channel is difficult to be formed. As a result, the threshold voltage of the transistor Q7(k) is raised. The more electrons are injected, the higher the threshold voltage can be. Hereinafter, electron injection to the silicon nitride film 13 (hereinafter referred to writing) and extraction of the accumulated electrons (hereinafter referred to cancellation or initialization) will be described.

Figure 3:
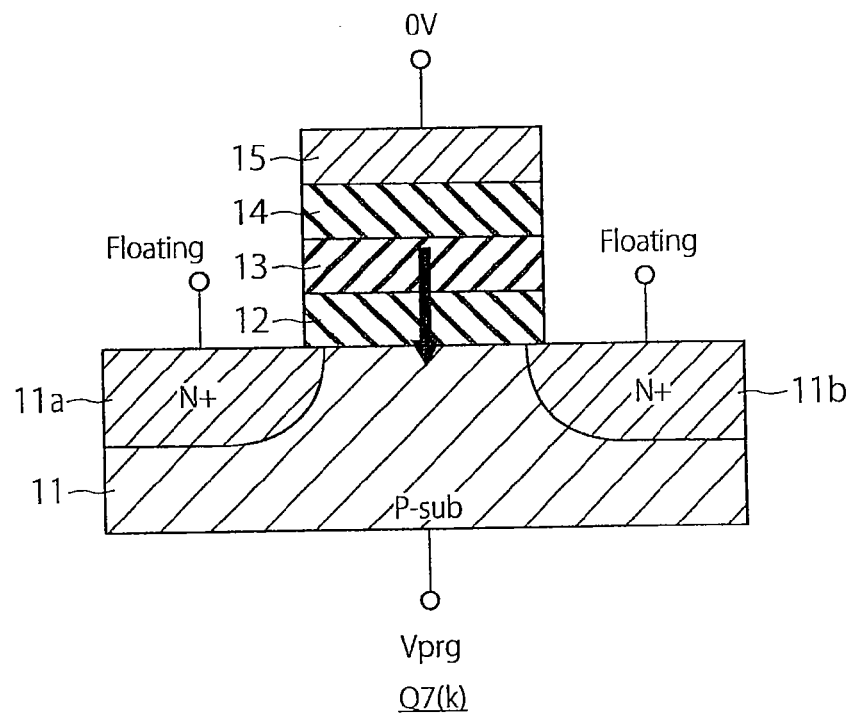
FIG. 3 is a cross-sectional view of the transistor Q7($k$) when the cancellation is performed.

FIG. 3 is a cross-sectional view of the transistor Q7(k) when the cancellation is performed. As shown in FIG. 3, the source and the drain are floating, the program voltage Vprg is applied to the silicon substrate 11, and 0 V is applied to the gate. As described above, the program voltage Vprg is higher than the power supply voltage VDD (for example, 10 V). Thereby, the accumulated electrons in the silicon nitride film 13 tunnel the tunnel oxide film 12 and are extracted to the silicon substrate 11. The reason why the source and the drain are floating is to prevent a leakage current from occurring between the source and the drain, between the source and the silicon substrate 11, and between the drain and the silicon substrate 11.

Figure 4:
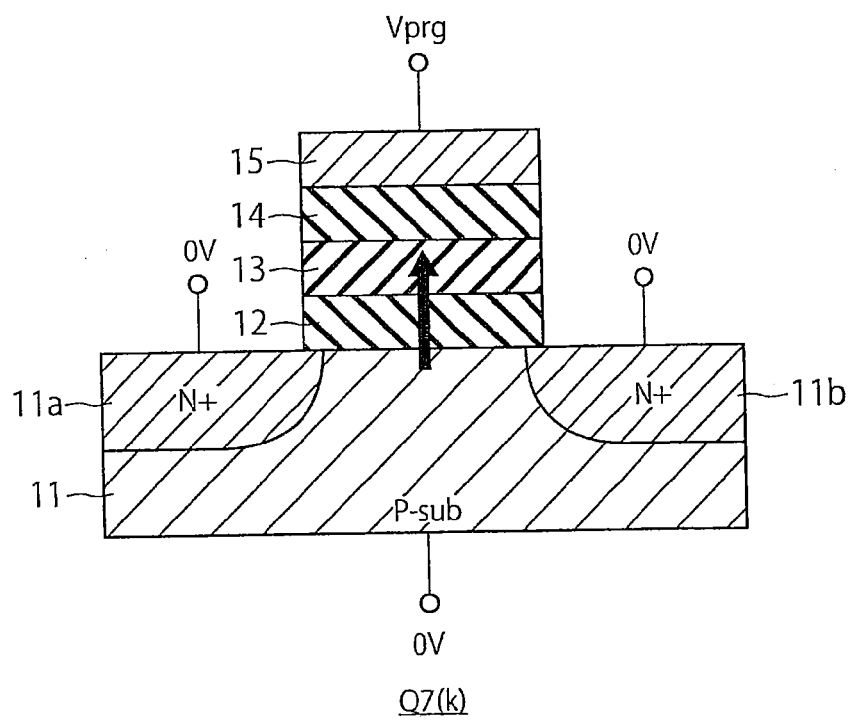
FIG. 4 is a cross-sectional view of the transistor Q7($k$) when the writing is performed.

FIG. 4 is a cross-sectional view of the transistor Q7(k) when the writing is performed. As shown in FIG. 4, 0 V is applied to the source and the drain, 0 V is applied to the silicon substrate 11, and the program voltage Vprg is applied to the gate. At this time, electrons tunnel the tunnel oxide film 12 from an inverted channel layer formed between the source and the drain and are injected into the silicon nitride film 13. The higher the program voltage Vprg and the longer the period of time during which the program voltage Vprg is applied, the more the amount of injected electrons. As a result, the threshold voltage is raised. The threshold voltage can be finely adjusted, for example, by several millivolts, according to the amount of the injected electrons.

In FIG. 4, if the source and the drain are floating, no channel is formed therebetween, so that the writing is not performed.

Next, a manner of adjusting the threshold voltage of the transistor Q7(k) in the DA converter 100 in FIG. 1 will be described. As known from the description below, the program voltage Vprg, which is higher than the power supply voltage VDD, is applied to not only the transistor Q7(k), but also the transistors Q1, Q3, Q4, and Q5, and thus, it is preferable that each of the transistors Q1, Q3, Q4, and Q5 are also a transistor having the SONOS structure instead of a normal transistor.

Figure 5:
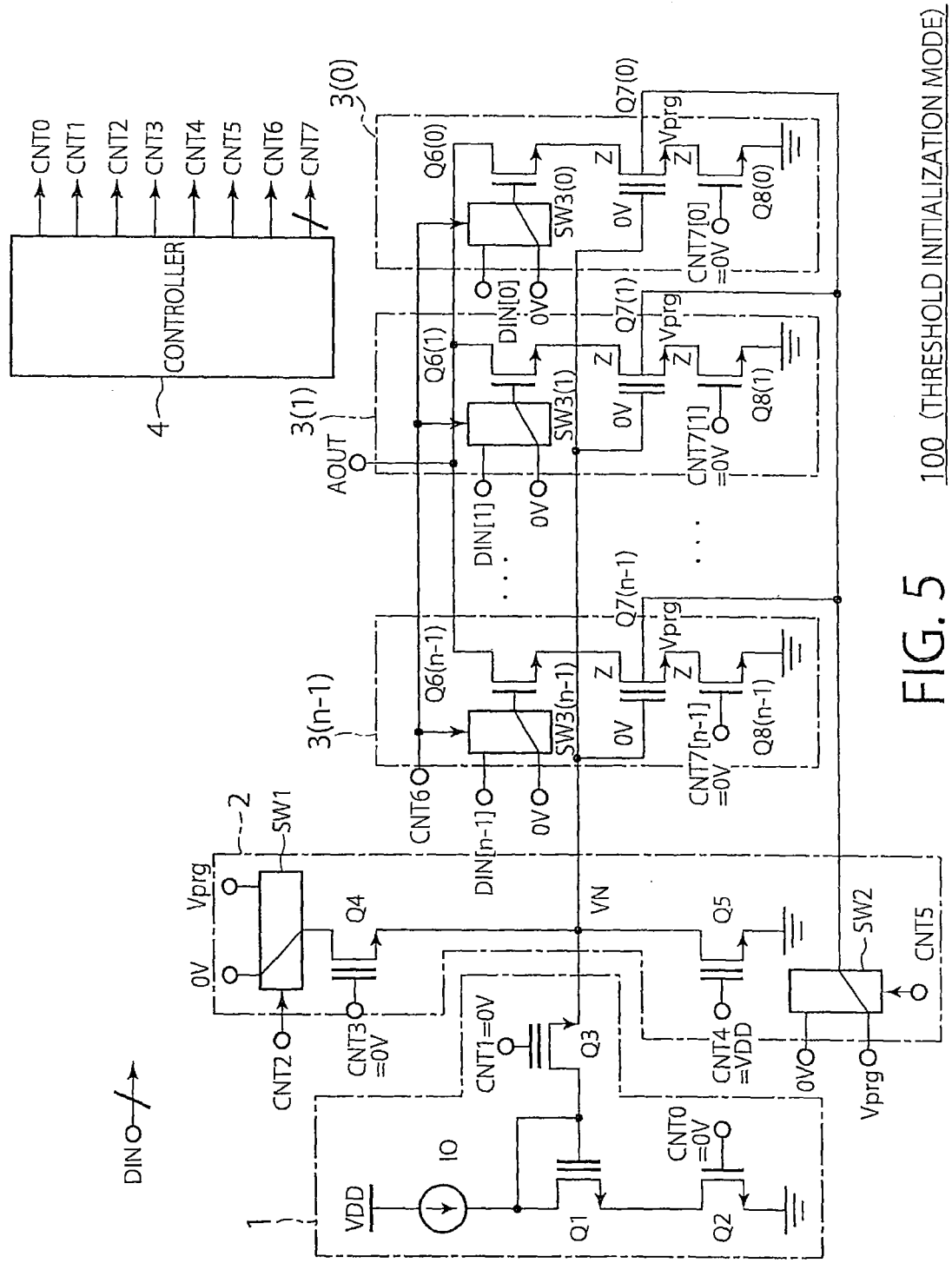
FIG. 5 is a circuit diagram of the DA converter 100 when the cancellation is performed (threshold initialization mode).

FIG. 5 is a circuit diagram of the DA converter 100 when the cancellation is performed (threshold initialization mode). Before the writing is performed, electrons injected into the silicon oxide films 13 of all the transistors Q7(n−1) to Q7(0) are extracted as a whole.

The controller 4 sets the control signal CNT0 to low (0 V). Thereby, the transistor Q2 in the current mirror 1 is turned off and a current hardly flows through the current mirror 1. Further, the controller 4 sets the control signal CNT1 to low. Thereby, the transistor Q3 is turned off and the current mirror 1 is electrically separated from the node VN.

The controller 4 sets the control signal CNT2 so that the switch SW1 selects 0 V. Further, the controller 4 sets the control signal CNT3 to low. Thereby, the transistor Q4 is turned off. In addition, the controller 4 sets the control signal CNT4 to high (VDD). Thereby, the transistor Q5 is turned on. As a result of the above, the node VN, that is, the gate voltage of the transistors Q7(n−1) to Q7(0), is set to 0 V.

The controller 4 sets the control signal CNT5 so that the switch SW2 selects the program voltage Vprg. Thereby, the voltage of the substrates of the transistors Q7(n−1) to Q7(0) in the voltage-current converters 3(n−1) to 3(0) is set to the program voltage Vprg.

The program voltage Vprg may be supplied from outside or may be generated by providing a charge pump (not shown in the drawings) in the DA converter 100 and raising the power supply voltage VDD.

The controller 4 sets the control signal CNT6 so that the switch SW3(n−1) to SW3(0) select 0 V. Thereby, the transistors Q6(n−1) to Q6(0) in the voltage-current converters 3(n−1) to 3(0) are turned off and the drains of the transistors Q7(n−1) to Q7(0) become floating (high impedance Z). Further, the controller 4 sets all bits of the n-bit control signal CNT7 (CNT7[n−1] to CNT7[0]) to low. Thereby, the transistors Q8(n−1) to Q8(0) are turned off and the sources of the transistors Q7(n−1) to Q7(0) also become floating.

Therefore, the transistors Q7(n−1) to Q7(0) become the state shown in FIG. 3 and the cancellation is performed. The signals are set to voltages shown in FIG. 5 for a period of time sufficient to perform the cancellation.

Subsequently, the writing is performed by injecting electrons into the silicon nitride films 13 of the transistors Q7(n−1) to Q7(0).

Figure 6:
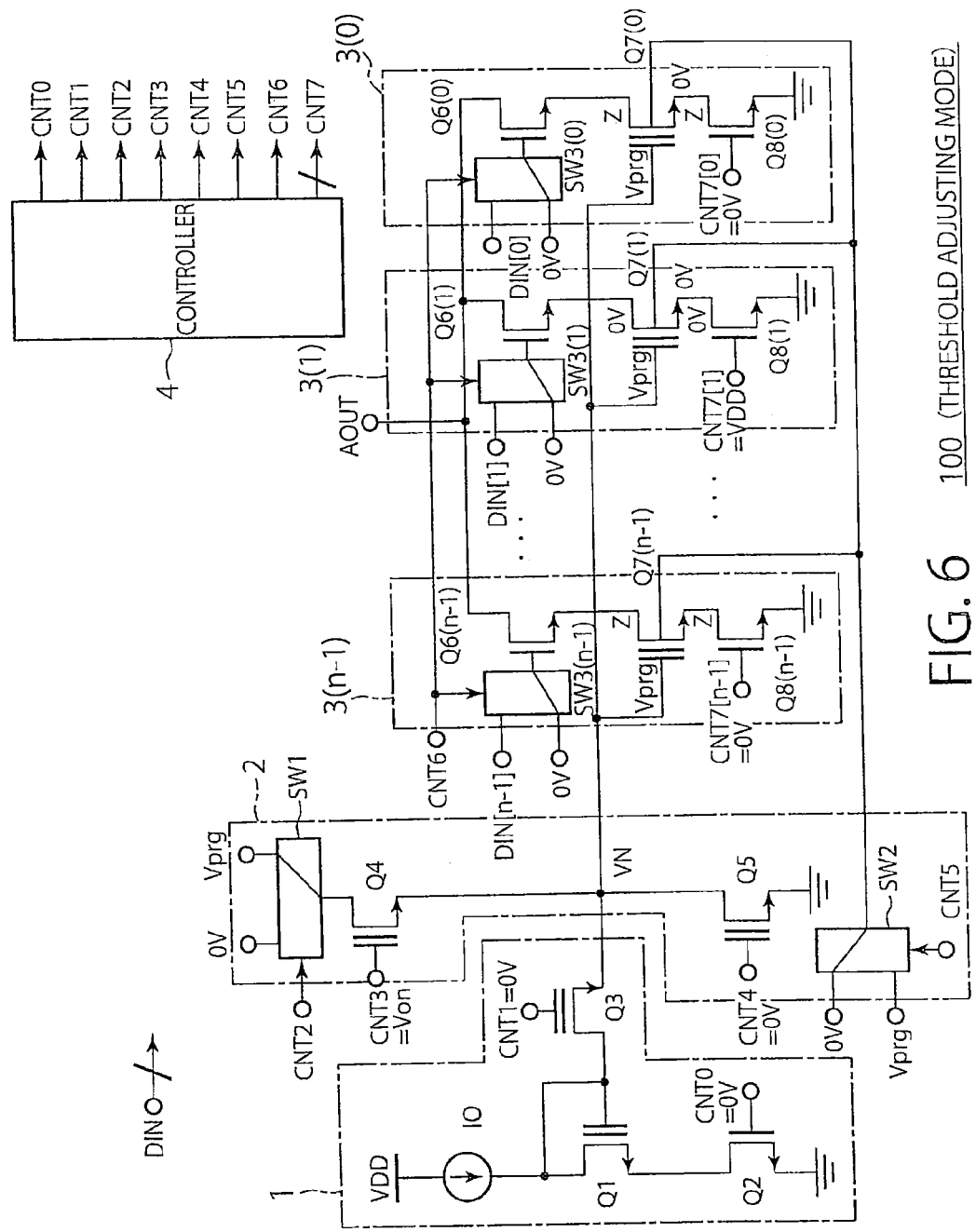
FIG. 6 is a circuit diagram of the DA converter 100 when the writing is performed (threshold adjusting mode).

FIG. 6 is a circuit diagram of the DA converter 100 when the writing is performed (threshold adjusting mode). The threshold voltage of each of the transistors Q7(n−1) to Q7(0) is checked in advance, and the threshold voltage of each of the transistors Q7(n−1) to Q7(0) is set a predetermined value one by one.

The setting of the control signals CNT0 and CNT1 are the same as that in the cancellation.

The controller 4 sets the control signal CNT2 so that the switch SW1 selects the program voltage Vprg. Further, the controller 4 sets the control signal CNT3 to a voltage Von for turning on the transistor Q4. The voltage Von is higher than the power supply voltage VDD and is, for example, 12 V, in order to supply the program voltage Vprg, which is higher than the power supply voltage VDD, to the node VN via the transistor Q4. In addition, the controller 4 sets the control signal CNT4 to low. Thereby, the transistor Q5 is turned off.

As a result of the above, the node VN, that is, the gate voltage of the transistors Q7(n−1) to Q7(0), is set to the program voltage Vprg.

The controller 4 sets the control signal CNT5 so that the switch SW2 selects 0 V. Thereby, the voltage of the substrates of the transistors Q7(n−1) to Q7(0) in the voltage-current converters 3(n−1) to 3(0) is set to 0 V.

The controller 4 sets the control signal CNT6 so that the switches SW3(n−1) to SW3(0) select 0 V. Thereby, the transistors Q6(n−1) to Q6(0) in the voltage-current converters 3(n−1) to 3(0) are turned off.

The controller 4 sets a bit of the control signal CNT7, which is inputted into one writing target transistor Q7(k), to high while sets the other bits to low. FIG. 6 shows an example in which the transistor Q7(1) in the voltage-current converter 3(1) is the writing target, and only the CNT7[1] is set to high.

Thereby, the transistor Q8(1) is turned on and the drain of the transistor Q8(1), that is, the source of the transistor Q7(1), is set to 0 V. The program voltage Vprg is applied to the gate of the transistor Q7(1), so that the transistor Q7(1) is turned on and the drain thereof is also set to 0 V. Therefore, the transistor Q7(1) becomes the state of FIG. 4 and the writing is performed. When the threshold voltage of the transistor Q7(1) is required to be much higher, the writing time is set to longer or the program voltage Vprg is set to higher.

On the other hand, in the other transistors Q7(k) (k≠1), the source and the drain are floating (high impedance Z) because the transistors Q6(k) and Q8(k) are off. Therefore, the writing is not performed.

The writing operation described above is performed for each of the transistors Q7(n−1) to Q7(0), so that it is possible to equalize the threshold voltages of the transistors Q7(n−1) to Q7(0).

Figure 7:
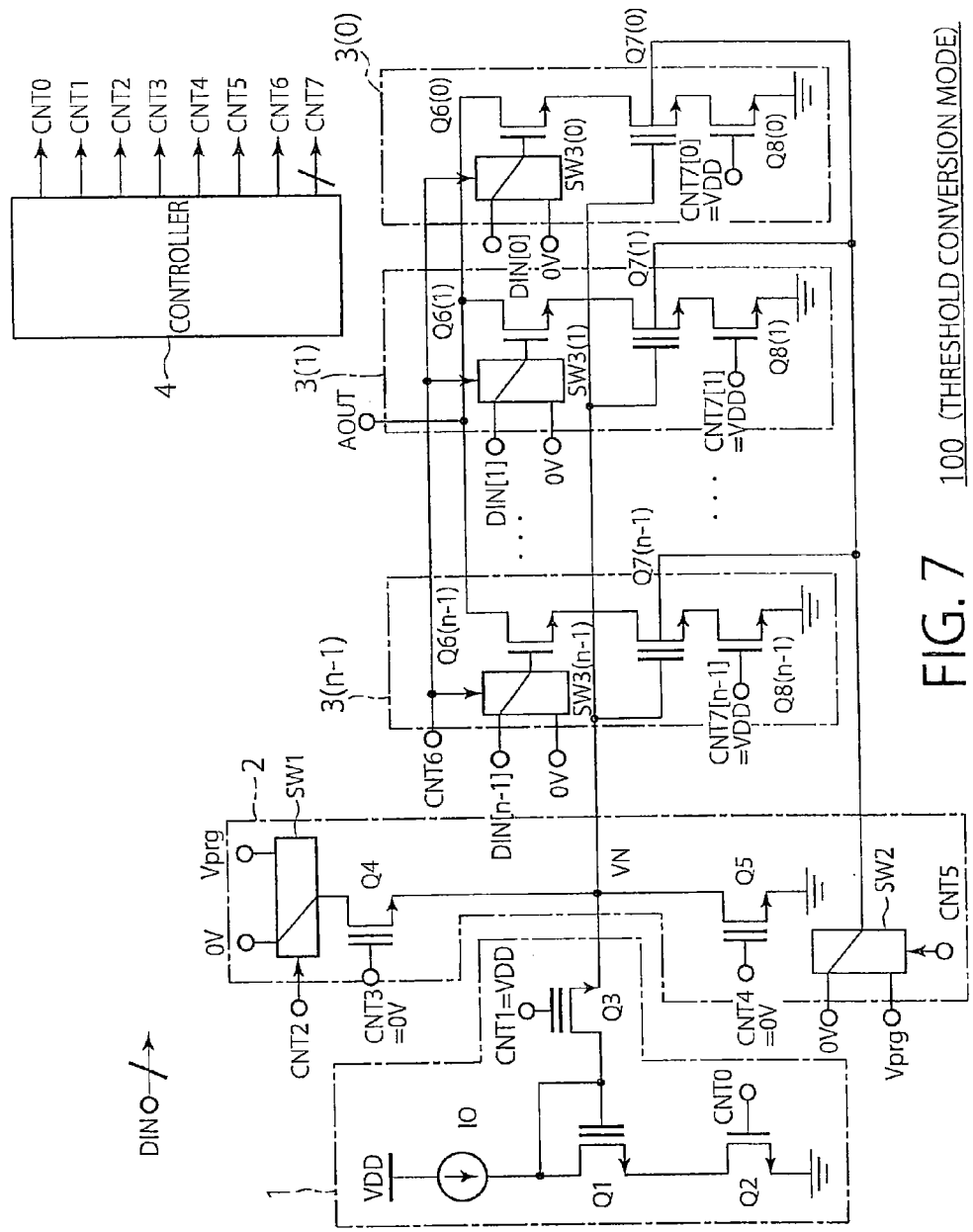
FIG. 7 is a circuit diagram of the DA converter 100 when the DA conversion is performed (DA conversion mode).

FIG. 7 is a circuit diagram of the DA converter 100 when the DA conversion is performed (DA conversion mode). By the setting shown in FIG. 7, the DA converter 100 operates as a current addition type DA converter.

The controller 4 sets the control signal CNT0 to high. Thereby, a current generated by the current source I0 flows between the power terminal and the ground terminal, so that a predetermined voltage is generated at the drain and the gate of the transistor Q1. Further, the controller 4 sets the control signal CNT1 to high and sets the control signals CNT3 and CNT4 to low. Thereby, the transistors Q4 and Q5 are turned off, while the transistor Q3 is turned on, so that a voltage generated by the current mirror 1 is supplied to the node VN, that is, the gates of the transistors Q7(n−1) to Q7(0).

The controller 4 generates the control signal CNT5 so that the switch SW2 selects 0 V. Thereby, 0 V is supplied to the substrates of the transistors Q7(n−1) to Q7(0).

The controller 4 generates the control signal CNT6 so that the switches SW3(n−1) to SW3(0) select values DIN[n−1] to DIN[0], respectively. Further, the controller 4 sets the control signals CNT7[n−1] to CNT7[0] to high. Thereby, the transistors Q8(n−1) to Q8(0) are turned on.

Therefore, the value DIN[k] connected to the voltage-current converter 3(k) is high, the transistor Q6(k) is turned on and a current flows through the voltage-current converter 3(k). The output current AOUT is obtained in which the currents flowing through the voltage-current converters 3(n−1) to 3(0) are summed up.

When the input digital signal DIN is a binary code, and the current driving force of the transistor Q7(0) is assumed to be β, the transistor Q7(k) is designed to have the current driving force of $2^k * \beta$. The current driving force can be adjusted by the gate width, the gate length, and the like of the transistor Q7(k). At this time, if the on-state current of the transistor Q7(0) is assumed to be I, the on-state current of the transistor Q7(k) is $2^{k}$*I. As described above, by adjusting and equalizing the threshold voltages of the transistors Q7(n−1) to Q7(0) in advance, it is possible to reduce the error of the on-state currents significantly.

Therefore, among the voltage-current converters 3(n−1) to 3(0), the transistor(s) Q6(k) in the voltage-current converter(s), the value DIN[k] of the k-th bit of the input digital signal DIN corresponding to the transistor(s) Q6(k) being high, is turned on and the current $2^{k}$*I flows. Then, the output current AOUT, which is a total sum of the generated currents and is accurately proportional to the value of the input digital signal DIN, can be obtained at the output terminal.

On the other hand, when the input digital signal DIN is a thermometer code and the number of highs in the input digital signal DIN represents the value thereof, transistors Q7(n−1) to Q7(0) are designed such that the current driving forces are equal to each other. In this case, if the value DIN[k] is high, each of the transistors Q7(n−1) to Q7(0) generates a current I. Then, the output current AOUT, which is a total sum of the generated currents and is accurately proportional to the value of the input digital signal DIN, can be obtained at the output terminal.

In this way, in the present embodiment, the voltage-current conversion is performed using the transistor Q7(k) with the adjustable threshold voltage having the SONOS structure. Therefore, the input digital signal DIN can be accurately converted into the output current AOUT.

As a DA converter having a simple configuration, a current addition type DA converter is considered in which switches and so-called binary weight current sources, the numbers of which are the same as the number of the bits of the digital signal, are parallel-connected. However, in such a current addition type DA converter, it is difficult to realize a sufficient conversion accuracy due to device mismatching such as the threshold values of the transistors that constitute the current sources.

To correct the device mismatching, it is considered that the threshold values are adjusted by floating gates. For example, there may be a configuration in which a current source for correcting the mismatch is added to each current source in the current addition type DA converter. However, in this configuration, the current source for correcting is required for every bit, so that the circuit size significantly increases. Further, a high voltage of about 10 V is applied to CMOS devices that are driven by a normal power supply voltage of about 3.3 V, so that the reliability of the circuit is not so high. In addition, not only a special power supply for supplying a positive voltage with respect to the ground voltage, but also a special power supply for supplying a negative voltage with respect to the ground voltage is required.

On the other hand, in the present embodiment, the threshold value is adjusted using the SONOS. Therefore, it is not necessary to add a current source for correcting to every bit of the digital signal, so that the circuit size can be reduced. Since the SONOS is a high-voltage-sustainable device, the reliability of the circuit is high. In addition, the SONOS operates using only one special power supply that supplies a positive voltage.

The DA converter 100 shown in FIG. 1 is just an example, and various modifications are can be conceivable. For example, although FIG. 1 shows an example in which the value DIN[k] is inputted into the transistor Q6(k), the value DIN[k] may be input into the transistor Q8(k) via a switch.

Figure 8:
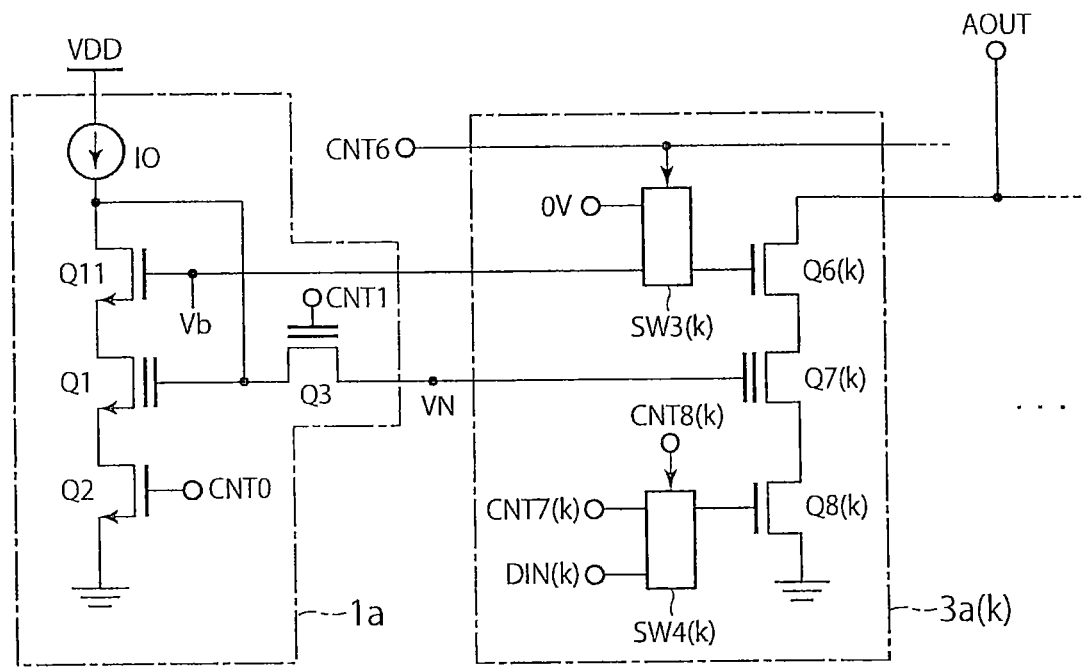
FIG. 8 is a circuit diagram of a DA converter 100$a$, which is a modified example of FIG. 1.

FIG. 8 is a circuit diagram of a DA converter 100a, which is a modified example of FIG. 1. In FIG. 8, the program module 2 and the controller 4, which are similar to those in FIG. 1, are omitted and only a voltage-current converter 3a(k) among voltage-current converters 3a(n−1) to 3a(0) is shown for simplifying the drawing. Hereinafter, the difference from FIG. 1 will be mainly described.

A current mirror 1a further includes an nMOS transistor Q11 connected between the current source I0 and the transistor Q1. A predetermined bias voltage Vb is supplied to the gate of the transistor Q11.

The switch SW3(k) is connected to the gate of the transistor Q6(k) in the voltage-current converter 3a(k). The bias voltage Vb and 0 V are inputted into the switch SW3(k), and one of these is outputted to the gate of the transistor Q6(k) according to the control signal CNT6. The switch SW4(k) is connected to the gate of the transistor Q8(k). The value DIN[k] and the control signal CNT7[k] are inputted into the switch SW4(k), and one of these is outputted to the gate of the transistor Q8(k) according to the control signal CNT8[k]. The controller 4 (not shown in FIG. 8) generates an n-bit control signal CNT8 including CNT8[n−1] to CNT8[0].

Although operations in the threshold value initialization mode, the threshold value adjusting mode, and the DA conversion mode are basically the same as those of the DA converter 100 in FIG. 1, a cascode connection of the transistors Q1 and Q11 is formed by providing the transistor Q11, so that it is possible to increase the output impedance of the voltage-current converter 3a(k).

Figure 9:
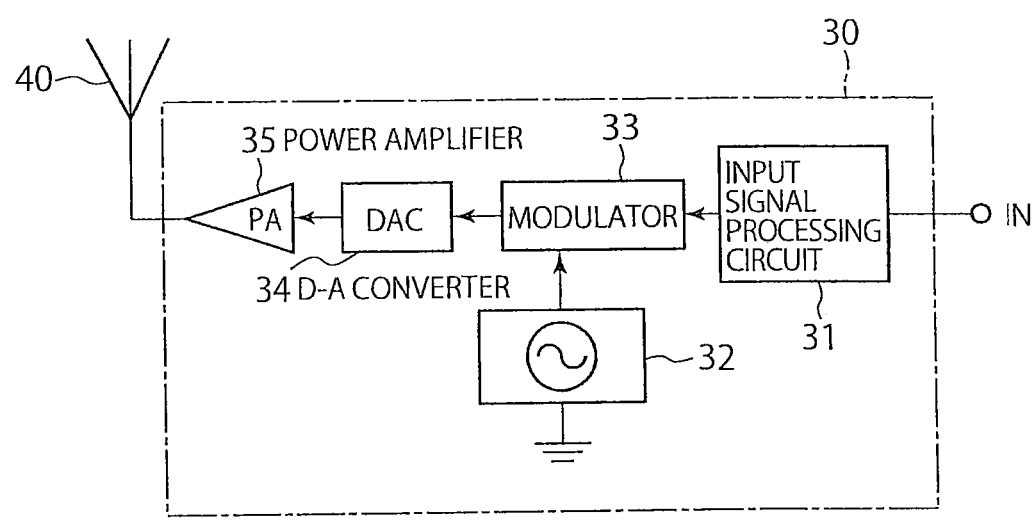
FIG. 9 is a schematic block diagram of a transmitter 30.

The DA converter described above is used in, for example, a wireless communication apparatus, in particular, a transmitter. FIG. 9 is a schematic block diagram of a transmitter 30. The transmitter 30 outputs a radio signal obtained by processing an input signal inputted from a baseband LSI (Large Scale Integrated circuit, not shown in FIG. 9) to an antenna 40. More specifically, the transmitter 30 includes an input signal processing circuit 31, a PLL circuit (oscillation signal generation circuit) 32, a modulator 33, a D-A converter (DAC) 34, and a power amplifier 35.

The input signal processing circuit 31 processes a signal inputted from outside. The PLL circuit 32 includes a VCO (Voltage Controlled Oscillator) and generates an LO signal. The modulator 33 modulates the output signal of the input signal processing circuit 31 on the basis of the LO signal. The D-A converter 34 is the DA converter described above. The D-A converter 34 converts a digital signal outputted from the modulator 33 to an analog signal. The power amplifier 35 amplifies the analog signal outputted from the D-A converter 34 and outputs the amplified analog signal to the antenna 40.

The DA converter described above may be used in audio equipment and the like.

The DA converter shown in FIG. 1 is just an example, and various modifications are possible. For example, at least part of the MOS transistors may be replaced by other semiconductors such as a bipolar transistor and Bi-CMOS. The conductivity type of the transistors may be reversed and a DA converter in which connection positions of the power terminal and the ground terminal are reversed accordingly may be configured. In this case, the basic operation principle is the same, When the transistor Q7(k) is a pMOS transistor, the program voltage Vprg is set to be lower than the ground voltage.

The entire circuit of the DA converter according to the embodiment may be formed on the same semiconductor substrate or part of the circuit may be formed on another semiconductor substrate. The DA converter according to the embodiment may be mounted on a printed circuit board using discrete components.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A DA converter configured to convert a digital signal comprising n (n>1) bits to an analog current to output the analog current from an output terminal,
the DA converter comprising n voltage-current converters each of which corresponds to each bit of the digital signal and is configured to generate a current depending on the corresponding bit,
wherein a k-th (k is an integer of 0 to n−1) voltage-current converter comprises a first switch, a first transistor whose threshold voltage is adjustable, and a second switch which are connected in series,
wherein the first switch is controlled by a value of the k-th bit of the digital signal or a first control signal, the first control signal being a signal for adjusting the threshold voltage of the first transistor,
the second switch is controlled by a second control signal for adjusting the threshold voltage of the first transistor,
the first transistor comprises:
a semiconductor substrate to which a reference voltage or a program voltage for adjusting the threshold voltage of the first transistor is applied;
a first diffusion region and a second diffusion region separated from each other in the semiconductor substrate, the first diffusion region being connected to the first switch, the second diffusion region being connected to the second switch;
an insulating film on the semiconductor substrate between the first diffusion region and the second diffusion region;
a charge accumulating film on the insulating film, the charge accumulating film being capable of accumulate a charge; and
a gate on the charge accumulating film, the program voltage or a predetermined bias voltage being applied to the gate.

2. The DA converter of claim 1 further comprising a controller configured to generate the first control signal and the second control signal to turn off the first switch and the second switch when the threshold voltage of the first transistor is initialized.

3. The DA converter of claim 1 further comprising a controller, when the threshold voltage of the first transistor is initialized, configured to generate the first control signal and the second control signal to:
apply the reference voltage to the gate of the first transistor;
set the first diffusion region and the second diffusion region of the first transistor to be floating; and
apply the program voltage to the semiconductor substrate of the first transistor.

4. The DA converter of claim 1 further comprising a controller, when adjusting the threshold of one of the first transistors, configured to:
generate the first control signal to turn off the first switch;
generate the second control signal to turn on the second switch serially-connected to the first transistor to be adjusted; and
generate the second control signal to turn off the second switch serially-connected to the first transistor not to be adjusted.

5. The DA converter of claim 1 further comprising a controller, when adjusting the threshold of one of the first transistors, configured to generate the first control signal and the second control signal to:
apply the program voltage to the gate of the first transistor to be adjusted;
apply the reference voltage to the first and second diffusion regions and the semiconductor substrate of the first transistor to be adjusted;
apply the program voltage to the gate of the first transistor not to be adjusted;
set the first and second diffusion regions and the semiconductor substrate of the first transistor not to be adjusted to be floating; and
apply the reference voltage to the semiconductor substrate of the first transistor not to be adjusted.

6. The DA converter of claim 1 further comprising a controller, when converting the digital signal to the analog current, configured to generate the first control signal and the second control signal to:
have the first switch controlled by a value of the k-th bit of the digital signal; and
turn on the second switch.

7. The DA converter of claim 1 further comprising a current mirror configured to generate the predetermined bias voltage.

8. The DA converter of claim 7, wherein the current mirror comprises:
a current source, a second transistor and a third switch connected in series; and
a fourth switch connected between a gate of the second transistor and the gate of the first transistor,
wherein the gate of the second transistor is connected to a connection node between the current source and the second transistor, and
the third switch and the fourth switch are controlled to be turned off when adjusting or initialing the threshold voltage of the first transistor.

9. The DA converter of claim 1 further comprising a programming module configured to:
when initializing the threshold voltage of the first transistor, apply the reference voltage to the gate of the first transistor and apply the program voltage to the semiconductor substrate of the first transistor; and
when adjusting the threshold voltage of the first transistor, apply the program voltage to the gate of the first transistor and apply the reference voltage to the semiconductor substrate of the first transistor.

10. The DA converter of claim 1, wherein:
the semiconductor substrate comprises a silicon substrate;
the insulating film comprises a silicon oxide film; and
the charge accumulating film comprises a silicon nitride film.

11. A wireless communication apparatus comprising:
an oscillation signal generator configured to generate an oscillation signal;
a modulator configured to modulate a signal inputted from outside based on the oscillation signal to generate a digital signal comprising n (n>1) bits;
a DA converter configured to convert the digital signal to an analog current signal to output the analog current signal from an output terminal; and
a power amplifier configured to amplify the analog current signal to transmit from an antenna, wherein the DA converter comprising n voltage-current converters each of which corresponds to each bit of the digital signal and is configured to generate a current depending on the corresponding bit, wherein a k-th (k is an integer of 0 to n−1) voltage-current converter comprises a first switch, a first transistor whose threshold voltage is adjustable, and a second switch which are connected in series, wherein the first switch is controlled by a value of the k-th bit of the digital signal or a first control signal, the first control signal being a signal for adjusting the threshold voltage of the first transistor, the second switch is controlled by a second control signal for adjusting the threshold voltage of the first transistor, the first transistor comprises:
a semiconductor substrate to which a reference voltage or a program voltage for adjusting the threshold voltage of the first transistor is applied;
a first diffusion region and a second diffusion region separated from each other in the semiconductor substrate, the first diffusion region being connected to the first switch, the second diffusion region being connected to the second switch;
an insulating film on the semiconductor substrate between the first diffusion region and the second diffusion region;
a charge accumulating film on the insulating film, the charge accumulating film being capable of accumulate a charge; and
a gate on the charge accumulating film, the program voltage or a predetermined bias voltage being applied to the gate.

12. The apparatus of claim 11, wherein the DA converter further comprises a controller configured to generate the first control signal and the second control signal to turn off the first switch and the second switch when the threshold voltage of the first transistor is initialized.

13. The apparatus of claim 11, wherein the DA converter further comprises a controller, when the threshold voltage of the first transistor is initialized, configured to generate the first control signal and the second control signal to:
apply the reference voltage to the gate of the first transistor;
set the first diffusion region and the second diffusion region of the first transistor to be floating; and
apply the program voltage to the semiconductor substrate of the first transistor.

14. The apparatus of claim 11, wherein the DA converter further comprises a controller, when adjusting the threshold of one of the first transistors, configured to:
generate the first control signal to turn off the first switch;
generate the second control signal to turn on the second switch serially-connected to the first transistor to be adjusted; and
generate the second control signal to turn off the second switch serially-connected to the first transistor not to be adjusted.

15. The apparatus of claim 11, wherein the DA converter further comprises a controller, when adjusting the threshold of one of the first transistors, configured to generate the first control signal and the second control signal to:
apply the program voltage to the gate of the first transistor to be adjusted;
apply the reference voltage to the first and second diffusion regions and the semiconductor substrate of the first transistor to be adjusted;
apply the program voltage to the gate of the first transistor not to be adjusted;
set the first and second diffusion regions and the semiconductor substrate of the first transistor not to be adjusted to be floating; and
apply the reference voltage to the semiconductor substrate of the first transistor not to be adjusted.

16. The apparatus of claim 11, wherein the DA converter further comprises a controller, when converting the digital signal to the analog current, configured to generate the first control signal and the second control signal to:
have the first switch controlled by a value of the k-th bit of the digital signal; and
turn on the second switch.

17. The apparatus of claim 11, wherein the DA converter further comprises a current mirror configured to generate the predetermined bias voltage.

18. The apparatus of claim 17, wherein the current mirror comprises:
a current source, a second transistor and a third switch connected in series; and
a fourth switch connected between a gate of the second transistor and the gate of the first transistor,
wherein the gate of the second transistor is connected to a connection node between the current source and the second transistor, and
the third switch and the fourth switch are controlled to be turned off when adjusting or initialing the threshold voltage of the first transistor.

19. The apparatus of claim 11, wherein the DA converter further comprising a programming module configured to:
when initializing the threshold voltage of the first transistor, apply the reference voltage to the gate of the first transistor and apply the program voltage to the semiconductor substrate of the first transistor; and
when adjusting the threshold voltage of the first transistor, apply the program voltage to the gate of the first transistor and apply the reference voltage to the semiconductor substrate of the first transistor.

20. The apparatus of claim 11, wherein:
the semiconductor substrate comprises a silicon substrate;
the insulating film comprises a silicon oxide film; and
the charge accumulating film comprises a silicon nitride film.

* * * * *